(12) United States Patent
Li et al.

(10) Patent No.: US 12,125,424 B2
(45) Date of Patent: Oct. 22, 2024

(54) GATE DRIVING CIRCUIT OUTPUTTING TWO SCAN SIGNALS WITH A SAME PHASE AND DISPLAY PANEL

(71) Applicant: WUHAN CHINA STAR OPTOELECTRONICS TECHNOLOGY CO., LTD., Wuhan (CN)

(72) Inventors: Mingyue Li, Wuhan (CN); Chao Tian, Wuhan (CN); Yanqing Guan, Wuhan (CN); Fei Ai, Wuhan (CN); Guanghui Liu, Wuhan (CN)

(73) Assignee: WUHAN CHINA STAR OPTOELECTRONICS TECHNOLOGY CO., LTD., Wuhan (CN)

( * ) Notice: Subject to any disclaimer, the term of this patent is extended or adjusted under 35 U.S.C. 154(b) by 0 days.

(21) Appl. No.: 17/605,546

(22) PCT Filed: Aug. 31, 2021

(86) PCT No.: PCT/CN2021/115642
§ 371 (c)(1),
(2) Date: Feb. 9, 2023

(87) PCT Pub. No.: WO2023/010635
PCT Pub. Date: Feb. 9, 2023

(65) Prior Publication Data
US 2024/0021122 A1 Jan. 18, 2024

(30) Foreign Application Priority Data
Aug. 5, 2021 (CN) .......................... 202110897495.2

(51) Int. Cl.
*G09G 3/20* (2006.01)

(52) U.S. Cl.
CPC ....... *G09G 3/20* (2013.01); *G09G 2310/0286* (2013.01)

(58) Field of Classification Search
CPC ............ G09G 3/20; G09G 2310/0286; G09G 3/3233; G09G 3/3266; G09G 3/3291; G11C 19/184; G11C 19/28; G11C 19/287
See application file for complete search history.

(56) References Cited

U.S. PATENT DOCUMENTS

2014/0093028 A1* 4/2014 Wu ........................ G11C 19/28
377/64
2015/0243237 A1* 8/2015 Li ........................ G11C 19/287
377/64

(Continued)

FOREIGN PATENT DOCUMENTS

| CN | 103208251 A | 7/2013 |
|----|-------------|--------|
| CN | 104835476 A | 8/2015 |

(Continued)

OTHER PUBLICATIONS

International Search Report in International application No. PCT/CN2021/115642, mailed on Apr. 29, 2022.

(Continued)

*Primary Examiner* — Richard J Hong
(74) *Attorney, Agent, or Firm* — PV IP PC; Wei Te Chung

(57) ABSTRACT

The present application discloses a gate driving circuit and a display panel. The gate driving circuit comprises a plurality of cascaded gate driving modules. A first driving signal can be output through a first output node, and at the same time, a second driving signal with a same phase as the first driving signal can be output through a second output node, and a gate driving sub-module and an in-phase output sub-module share the first output node and a pull-down (Continued)

node, which simplifies a circuit topology of the gate driving circuit.

20 Claims, 4 Drawing Sheets

(56) References Cited

U.S. PATENT DOCUMENTS

| | | | |
|---|---|---|---|
| 2015/0294733 A1* | 10/2015 | Tan | G11C 19/184 377/68 |
| 2019/0096500 A1* | 3/2019 | Gu | G09G 3/20 |
| 2020/0020266 A1* | 1/2020 | Feng | G11C 19/28 |
| 2020/0027516 A1* | 1/2020 | Feng | G09G 3/3291 |
| 2020/0273418 A1 | 8/2020 | Zhang | |
| 2021/0358381 A1* | 11/2021 | Wang | G09G 3/3266 |
| 2023/0009494 A1* | 1/2023 | Noh | G09G 3/3233 |

FOREIGN PATENT DOCUMENTS

| | | |
|---|---|---|
| CN | 109493816 A | 3/2019 |
| CN | 112509531 A | 3/2021 |

OTHER PUBLICATIONS

Written Opinion of the International Search Authority in International application No. PCT/CN2021/115642, mailed on Apr. 29, 2022.

Chinese Office Action issued in corresponding Chinese Patent Application No. 202110897495.2 dated Aug. 2, 2022, pp. 1-6.

* cited by examiner

GATE DRIVING CIRCUIT OUTPUTTING TWO SCAN SIGNALS WITH A SAME PHASE AND DISPLAY PANEL

RELATED APPLICATIONS

This application is a Notional Phase of PCT Patent Application No. PCT/CN2021/115642 having international filing date of Aug. 31, 2021, which claims the benefit of priority of Chinese Patent Application No. 202110897495.2 filed on Aug. 5, 2021. The contents of the above applications are all incorporated by reference as if fully set forth herein in their entirety.

BACKGROUND OF DISCLOSURE

Field of Disclosure

The present disclosure relates to a field of display panel manufacturing, and in particular to a gate driving circuit and a display panel.

Description of Prior Art

A gate driving circuit can also be called a gate driver on array (GOA) circuit, which uses a substrate manufacturing process of an existing thin film transistor display array to provide a gate row scan driving signal circuit on an array substrate, in order to realize a driving mode of gate progressive scanning.

As shown in FIG. 1, a gate driving circuit in a traditional technical solution comprises a plurality of cascaded gate driving units. Each of the gate driving units usually comprises a pull-up control module 1, a pull-up module 2, a pull-down control module 3, and a pull-down module 4. The pull-up control module 1 and the pull-up module 2 are electrically connected to form a first node N1, the pull-down control module 3 and the pull-down module 4 are electrically connected to form a second node N2, a feedback module 5 is electrically connected between the first node N1 and the second node N2, and the pull-up module 2 and the pull-down module 4 are electrically connected to form a third node N3, wherein the third node N3 is used to output a corresponding scan signal.

However, the gate driving unit of any stage in the above-mentioned traditional technical solution is generally unable to output two scan signals with a same phase, or outputting two scan signals with a same phase requires a gate driving unit with a complex circuit topology, which is not conducive to development needs of display industry.

It should be noted that the above introduction of the background technology is only to facilitate a clear and complete understanding of technical solutions of the present disclosure. Therefore, it cannot be considered that the above-mentioned technical solutions involved are known to those skilled in the art just because it appears in the background art of the present disclosure.

SUMMARY OF DISCLOSURE

The present disclosure provides a gate driving circuit and a display panel to alleviate a technical problem that a circuit topology of a gate driving circuit that outputs a plurality of driving signals in a same phase is too complicated.

In one aspect, the present disclosure provides a gate driving circuit, comprising a plurality of cascaded gate driving modules, wherein one of the gate driving modules comprises: a gate driving sub-module comprising a first output node and a pull-down node, wherein the first output node is used to output a first driving signal; and an in-phase output sub-module comprising a first control node, a second control node, and a second output node, wherein the first control node is electrically connected to the first output node, and the second control node is electrically connected to the pull-down node, the second output node is used to output a second driving signal, and a phase of the second driving signal is same as a phase of the first driving signal.

In some embodiments, the one of the gate driving modules further comprises: a first wire electrically connected to the gate driving sub-module for transmitting a first constant low voltage potential signal; a second wire electrically connected to the in-phase output sub-module for transmitting a second constant low voltage potential signal; a third wire electrically connected to the gate driving sub-module for transmitting a first constant high voltage potential signal; and a fourth wire electrically connected to the in-phase output sub-module for transmitting a second constant high voltage potential signal.

In some embodiments, the gate driving sub-module comprises: a pull-up unit; and a pull-down unit, wherein an output terminal of the pull-down unit is electrically connected to an output terminal of the pull-up unit and the first output node.

In some embodiments, the gate driving sub-module further comprises: a pull-down control unit, wherein an output terminal of the pull-down control unit is electrically connected to a control terminal of the pull-down unit and the pull-down node.

In a second aspect, the present disclosure provides a gate driving circuit, comprising a plurality of cascaded gate driving modules, wherein one of the gate driving modules comprises: a first transistor, wherein one of a source or a drain of the first transistor is electrically connected to a first output node for outputting a first driving signal; a second transistor, wherein one of a source or a drain of the second transistor is electrically connected to the first output node, and a gate of the second transistor is electrically connected to a pull-down node; a third transistor, wherein a gate of the third transistor is electrically connected to the first output node, one of a source or a drain of the third transistor is electrically connected to a second output node, and the second output node is used to output a second driving signal; and a fourth transistor, wherein a gate of the fourth transistor is electrically connected to the pull-down node, and one of a source or a drain of the fourth transistor is electrically connected to the second output node; wherein a phase of the first driving signal is same as a phase of the second driving signal.

In some embodiments, the one of the gate driving modules further comprises: a fifth transistor, wherein one of a source or a drain of the fifth transistor is electrically connected to a gate of the first transistor.

In some embodiments, the one of the gate driving modules further comprises: a first wire electrically connected to the other of the source or the drain of the second transistor for transmitting a first constant low voltage potential signal; a second wire electrically connected to the other of the source or the drain of the fourth transistor for transmitting a second constant low voltage potential signal; a third wire electrically connected to a gate of the fifth transistor for transmitting a first constant high voltage potential signal; and a fourth wire electrically connected to the other of the source or the drain of the third transistor for transmitting a second constant high voltage potential signal.

In a third aspect, the present disclosure provides a display panel, comprising: the gate driving circuit in any of the above embodiments; a plurality of scan lines, wherein one of the scan lines is electrically connected to one of the first output node and the second output node; and a light-shielding metal layer comprising at least one light-shielding metal block, wherein the at least one light-shielding metal block is electrically connected to the other of the first output node and the second output node.

In some embodiments, the display panel further comprises: a display area, wherein the at least one light-shielding metal block is located in the display area; and a non-display area, wherein at least part of the one of the scan lines is located in the non-display area.

In some embodiments, in a thickness direction of the display panel, the one of the scan lines at least partially overlaps the at least one light-shielding metal block.

The gate driving circuit and the display panel provided in the present disclosure can output the first driving signal through the first output node, and can output the second driving signal with the same phase as the first driving signal through the second output node, which can output a plurality of driving signals of a same phase. In addition, the gate driving sub-module and the in-phase output sub-module share the first output mode and the pull-down node, which simplifies a circuit topology of the gate driving circuit, thereby conductive to realizing a narrow frame of the display panel.

DETAILED DESCRIPTION OF EMBODIMENTS

In order to make purpose, technical solutions, and effects of the present disclosure clear, the following further describes the present disclosure in detail with reference to the accompanying drawings and embodiments. It should be understood that specific embodiments described here are only used to explain the present disclosure, and are not used to limit the present disclosure.

Figure 1:
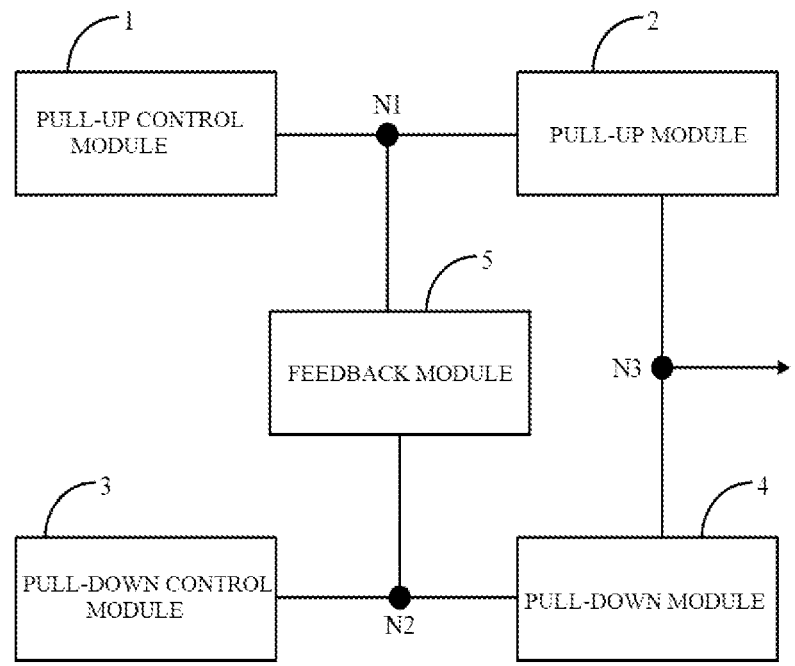
FIG. 1 is a schematic structural diagram of a gate driving circuit in a traditional technical solution.
Figure 2:
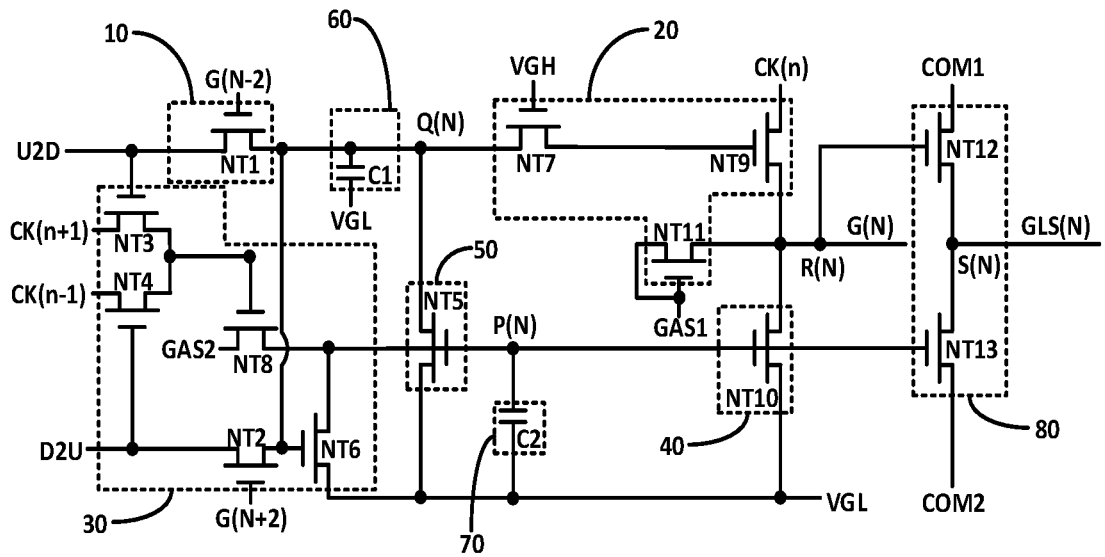
FIG. 2 is a first schematic structural diagram of a gate driving circuit provided by an embodiment of the present disclosure.

Please refer to FIGS. 2-7. As shown in FIG. 2, this embodiment provides a gate driving circuit. The gate driving circuit comprises a plurality of cascaded gate driving modules, and one of the gate driving modules comprises a gate driving sub-module and an in-phase output sub-module 80. The gate driving sub-module comprises a first output node R(N) and a pull-down node P(N), and the first output node R(N) is used to output a first driving signal. The in-phase output sub-module 80 comprises a first control node, a second control node, and a second output node S(N). The first control node is electrically connected to the first output node R(N), and the second control node is electrically connected to the pull-down node P(N), the second output node S(N) is used to output a second driving signal GLS(N), and a phase of the second driving signal GLS(N) is same as a phase of the first driving signal.

It can be understood that the gate driving circuit provided in this embodiment can output the first driving signal through the first output node R(N), and at the same time, can also output the second driving signal GLS(N) with a same phase as the first driving signal through the second output node S(N), which can output a plurality of driving signals of a same phase. In addition, the gate driving sub-module and the in-phase output sub-module 80 share the first output node R(N) and the pull-down node P(N), which simplifies a circuit topology of the gate driving circuit, and facilitates realization of a narrow frame of a display panel.

It should be noted that in this embodiment, a corresponding control node may be a gate of a corresponding thin film transistor. For example, the first control node may be a gate of a first thin film transistor NT12, and the second control node may be a gate of a second thin film transistor NT13. Wherein, the first driving signal may also be a scan signal G(N) of a N-th stage.

In one of the embodiments, one of the gate driving modules further comprises a first wire, a second wire, a third wire, and a fourth wire. The first wire is electrically connected to the gate driving sub-module for transmitting a first constant low voltage potential signal VGL; the second wire is electrically connected to the in-phase output sub-module 80 for transmitting a second constant low voltage potential signal COM2; the third wire is electrically connected to the gate driving sub-module for transmitting a first constant high voltage potential signal VGH; and the fourth wire is electrically connected to the in-phase output sub-module 80 for transmitting a second constant high voltage potential signal COM1.

It can be understood that, in this embodiment, the gate driving sub-module and the in-phase output sub-module 80 independently use a set of constant high voltage potential signals and constant low voltage potential signals, and on a basis of achieving an in-phase output, the two can be adjusted independently, which is conducive to meeting diversified needs of a display panel.

Wherein, a potential of the second constant high voltage potential signal COM1 may be less than or equal to a potential of the first constant high voltage potential signal VGH. A potential of the second constant low voltage potential signal COM2 may be equal to or approximately equal to a potential of the first constant low voltage potential signal VGL.

In one of the embodiments, the in-phase output sub-module 80 may comprise the first thin film transistor NT12 and the second thin film transistor NT13. One of a source or a drain of the first thin film transistor NT12 is electrically connected to the fourth wire, the gate of the first thin film transistor NT12 is electrically connected to the first output node R(N), another one of the source or the drain of the first thin film transistor NT12 is electrically connected to one of a source or a drain of the second thin film transistor NT13 and the second output node S(N), the gate of the second thin film transistor NT13 is electrically connected to the pull-down node P(N), and another one of the source or the drain of the second thin film transistor NT13 is electrically connected to the second wire.

In one of the embodiments, the gate driving sub-module comprises a pull-up unit 20 and a pull-down unit 40, and an output terminal of the pull-down unit 40 is electrically connected to an output terminal of the pull-up unit 20 and the first output node R(N).

In one of the embodiments, the pull-up unit 20 comprises a third thin film transistor NT9, one of a source or a drain of the third thin film transistor NT9 is electrically connected to a fifth wire, and another one of the source or the drain of the third thin film transistor NT9 is electrically connected to the first output node R(N).

Wherein, the fifth wire may be used to transmit a n-th clock signal CK(n), and n may be a positive integer.

In one of the embodiments, the pull-up unit 20 further comprises a fourth thin film transistor NT7, one of a source or a drain of the fourth thin film transistor NT7 is electrically connected to a gate of the third thin film transistor NT9, and a gate of the fourth thin film transistor NT7 is electrically connected to the third wire.

In one of the embodiments, the pull-up unit 20 further comprises a fifth thin film transistor NT11, one of a source or a drain of the fifth thin film transistor NT11 is electrically connected to the first output node R(N), and a gate of the fifth thin film transistor NT11 is electrically connected to a sixth wire and another one of the source or the drain of the fifth thin film transistor NT11.

Wherein, the sixth wire may be used to transmit a first global control signal GAS1.

In one of the embodiments, the pull-down unit 40 comprises a sixth thin film transistor NT10, one of a source or a drain of the sixth thin film transistor NT10 is electrically connected to the first output node R(N), a gate of the sixth thin film transistor NT10 is electrically connected to the pull-down node P(N), and another one of the source or the drain of the sixth thin film transistor NT10 is electrically connected to the first wire.

In one of the embodiments, the gate driving sub-module further comprises a pull-down control unit 30, and an output terminal of the pull-down control unit 30 is electrically connected to a control terminal of the pull-down unit 40 and the pull-down node P(N).

In one of the embodiments, the pull-down control unit 30 comprises a seventh thin film transistor NT3, an eighth thin film transistor NT8, and a ninth thin film transistor NT4. One of a source or a drain of the seventh thin film transistor NT3 is connected to a seventh wire, a gate of the seventh thin film transistor NT3 is electrically connected to an eighth wire, and another one of the source or the drain of the seventh thin film transistor NT3 is electrically connected to a gate of the eighth thin film transistor NT8; one of a source or a drain of the eighth thin film transistor NT8 is electrically connected to a ninth wire, and another one of the source or the drain of the eighth thin film transistor NT8 is electrically connected to the pull-down node P(N); one of a source or a drain of the ninth thin film transistor NT4 is electrically connected to a tenth wire, another one of the source or the drain of the ninth thin film transistor NT4 is electrically connected to the gate of the eighth thin film transistor NT8, and a gate of the ninth thin film transistor NT4 is electrically connected to an eleventh wire.

Wherein, the seventh wire may be used to transmit an (n+1)-th clock signal CK(n+1), the eighth wire may be used to transmit a forward scan control signal U2D, the ninth wire may be used to transmit a second global control signal GAS2, the tenth wire may be used to transmit an (n−1)-th clock signal CK(n−1), and the eleventh wire may be used to transmit a reverse scan control signal D2U.

In one of the embodiments, the pull-down control unit 30 further comprises a tenth thin film transistor NT2 and an eleventh thin film transistor NT6, one of a source or a drain of the tenth thin film transistor NT2 is electrically connected to the eleventh wire, a gate of the tenth thin film transistor NT2 is electrically connected to a twelfth wire, and another one of the source or the drain of the tenth thin film transistor NT2 is electrically connected to a pull-up node Q(N) and a gate of the eleventh thin film transistor NT6; one of a source or a drain of the eleventh thin film transistor NT6 is electrically connected to the first wire, and another one of the source or the drain of the eleventh thin film transistor NT6 is electrically connected to the pull-down node P(N).

Wherein, the twelfth wire may be used to transmit a scan signal G(N+2) of an (N+2)-th stage.

In one of the embodiments, the gate driving sub-module further comprises an input unit 10, and an output terminal of the input unit 10 is electrically connected to the pull-up node Q(N).

In one of the embodiments, the input unit 10 comprises a twelfth thin film transistor NT1, one of a source or a drain of the twelfth thin film transistor NT1 is electrically connected to the eighth wire, a gate of the twelfth thin film transistor NT1 is electrically connected to a thirteenth wire, another one of the source or the drain of the twelfth thin film transistor NT1 is electrically connected to the pull-up node Q(N) and another one of the source or the drain of the fourth thin film transistor NT7.

Wherein, the thirteenth wire may be used to transmit a scan signal G(N−2) of a (N−2)-th stage.

In one of the embodiments, the gate driving sub-module further comprises a feedback unit 50. An input terminal of the feedback unit 50 is electrically connected to the first wire, a control terminal of the feedback unit 50 is electrically connected to the pull-down node P(N), and an output terminal of the feedback unit 50 is electrically connected to the pull-up node Q(N).

In one of the embodiments, the feedback unit 50 comprises a thirteenth thin film transistor NT5, one of a source or a drain of the thirteenth thin film transistor NT5 is electrically connected to the first wire, a gate of the thirteenth thin film transistor NT5 is electrically connected to the pull-down node P(N), and another one of the source or the drain of the thirteenth thin film transistor NT5 is electrically connected to the pull-up node Q(N).

In one of the embodiments, the gate driving sub-module further comprises a first voltage stabilizing unit 60. One terminal of the first voltage stabilizing unit 60 is electrically connected to the first wire, and another terminal of the first voltage stabilizing unit 60 is electrically connected to the pull-up node Q(N).

In one of the embodiments, the first voltage stabilizing unit 60 comprises a first capacitor C1, one terminal of the first capacitor C1 is electrically connected to the first wire, and another terminal of the first capacitor C1 is electrically connected to the pull-up node Q(N).

In one of the embodiments, the gate driving sub-module further comprises a second voltage stabilizing unit 70, one terminal of the second voltage stabilizing unit 70 is electrically connected to the first wire, and another terminal of the second voltage stabilizing unit 70 is electrically connected to the pull-down node P(N).

In one of the embodiments, the second voltage stabilizing unit 70 comprises a second capacitor C2, one terminal of the second capacitor C2 is electrically connected to the first wire, and another terminal of the second capacitor C2 is electrically connected to the pull-down node P(N).

In one of the embodiments, at least one of the first thin film transistor NT12 to the thirteenth thin film transistor NT5 may be, but not limited to, an N-channel type thin film transistor, and may also be correspondingly adjusted to a P-channel type thin film transistor.

Figure 3:
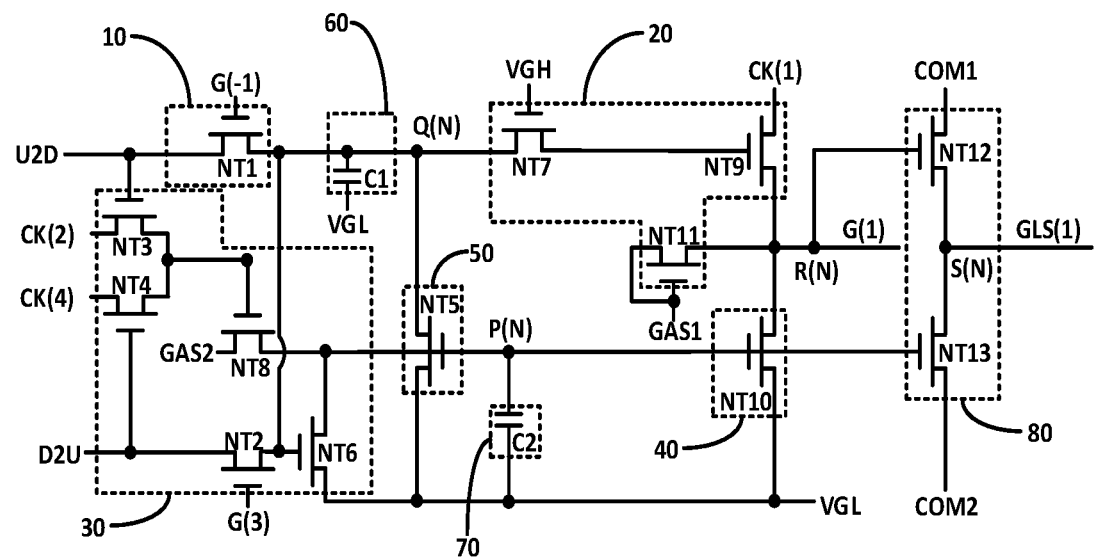
FIG. 3 is a second schematic structural diagram of a gate driving circuit provided by an embodiment of the present disclosure.

In one of the embodiments, differences between a gate driving module shown in FIG. 3 and the gate driving module shown in FIG. 2 are that when n is equal to 1 and N is also equal to 1, one of the source or the drain of the third thin film transistor NT9 is configured to connect to a first clock signal CK(1); one of the source or the drain of the seventh thin film transistor NT3 is configured to connect to a second clock signal CK(2); one of the source or the drain of the ninth thin film transistor NT4 is configured to connect to a fourth clock signal CK(4); and the gate of the twelfth thin film transistor NT1 is used to connect to a scan signal G(−1) of a first negative stage, and the scan signal G(−1) of the first negative stage can be replaced by an initial signal; and the gate of the tenth thin film transistor NT2 is used to connect to a scan signal G(3) of a third stage. Correspondingly, at this time, the first driving signal output by the first output node R(N) may be used as a scan signal G(1) of a first stage, and the second driving signal GLS(N) output by the second output node S(N) may be a driving signal GLS(1).

Figure 4:
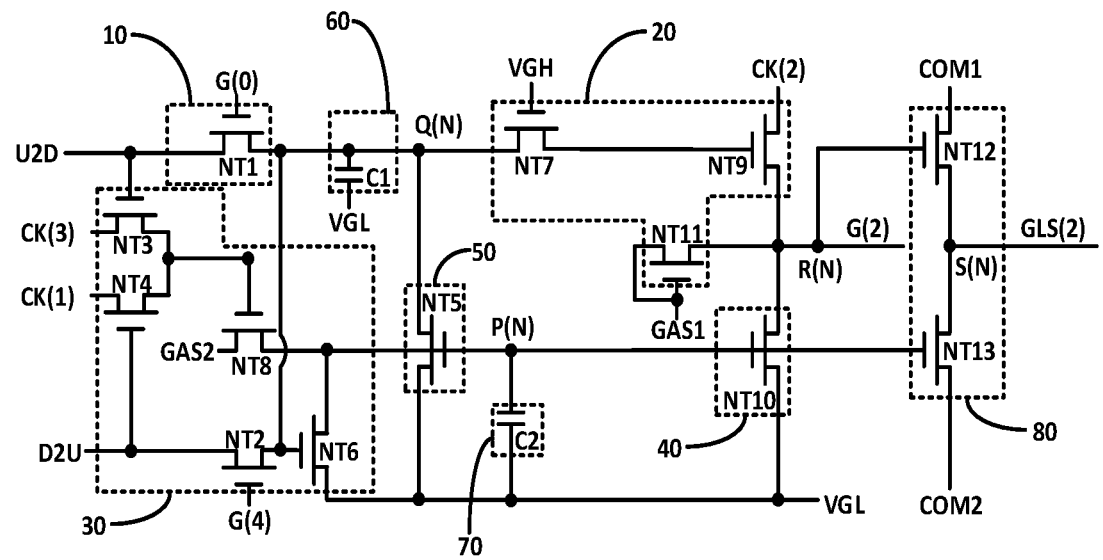
FIG. 4 is a third schematic structural diagram of a gate driving circuit provided by an embodiment of the present disclosure.

In one of the embodiments, differences between a gate driving module shown in FIG. 4 and the gate driving module shown in FIG. 2 are that when n is equal to 2 and N is also equal to 2, one of the source or the drain of the third thin film transistor NT9 is used to connect to the second clock signal CK(2); one of the source or the drain of the seventh thin film transistor NT3 is used to connect to a third clock signal CK(3); one of the source or the drain of the ninth thin film transistor NT4 is used to connect to the first clock signal CK(1); the gate of the twelfth thin film transistor NT1 is used to connect to a scan signal G(0) of a zeroth stage, and the scan signal G(0) of the zeroth stage can also be replaced by another initial signal; and the gate of the tenth thin film transistor NT2 is used to connect to a scan signal G(4) of a fourth stage. Correspondingly, at this time, the first driving signal output by the first output node R(N) may be used as a scan signal G(2) of a second stage, and the second driving signal GLS(N) output by the second output node S(N) may be a driving signal GLS(2).

Figure 5:
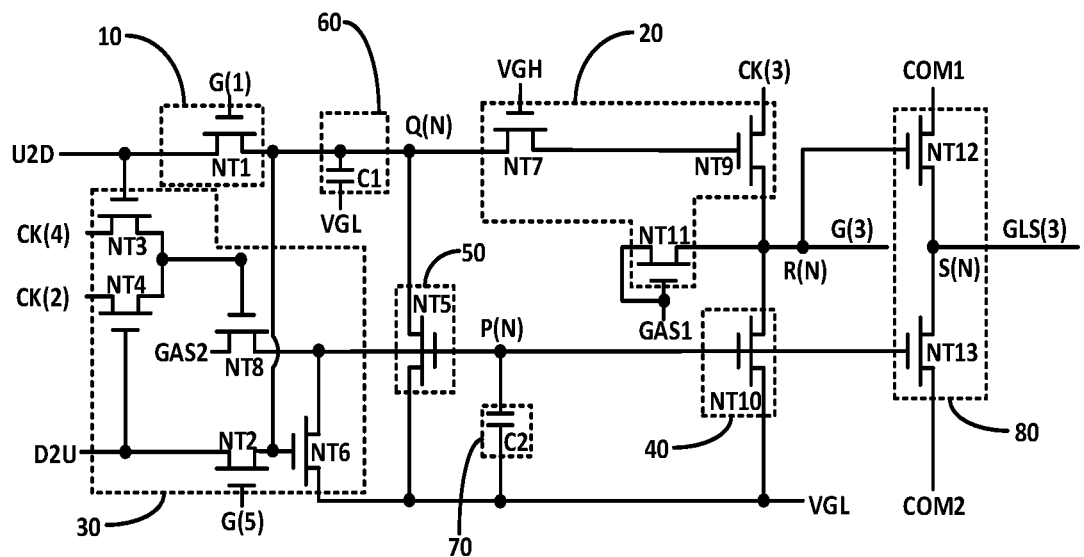
FIG. 5 is a fourth schematic structural diagram of a gate driving circuit provided by an embodiment of the present disclosure.

In one of the embodiments, differences between a gate driving module shown in FIG. 5 and the gate driving module shown in FIG. 2 are that when n is equal to 3 and N is also equal to 3, one of the source or the drain of the third thin film transistor NT9 is used to connect to the third clock signal CK(3); one of the source or the drain of the seventh thin film transistor NT3 is used to connect to the fourth clock signal CK(4); one of the source or the drain of the ninth thin film transistor NT4 is used to connect to the second clock signal CK(2); the gate of the twelfth thin film transistor NT1 is used to connect to the scan signal G(1) of the first stage; and the gate of the tenth thin film transistor NT2 is used to connect to a scan signal G(5) of a fifth stage. Correspondingly, at this time, the first driving signal output by the first output node R(N) can be used as the scan signal G(3) of the third stage, and the second driving signal GLS(N) output by the second output node S(N) may be a driving signal GLS(3).

Figure 6:
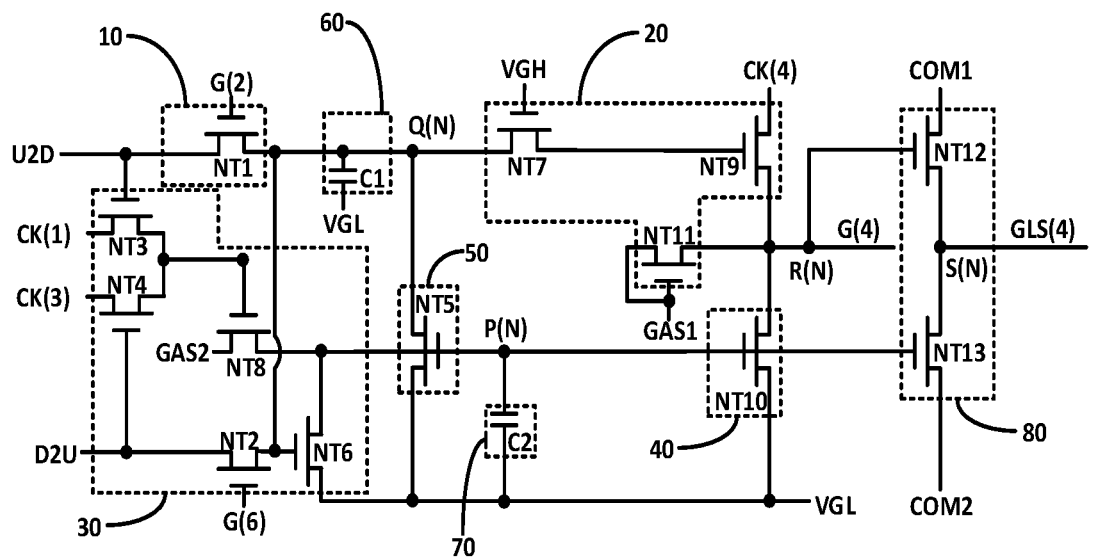
FIG. 6 is a fifth schematic structural diagram of a gate driving circuit provided by an embodiment of the present disclosure.

In one of the embodiments, differences between a gate driving module shown in FIG. 6 and the gate driving module shown in FIG. 2 are that when n is equal to 4 and N is also equal to 4, one of the source or the drain of the third thin film transistor NT9 is used to connect to the fourth clock signal CK(4); one of the source or the drain of the seventh thin film transistor NT3 is used to connect to the first clock signal CK(1); one of the source or the drain of the ninth thin film transistor NT4 is used to connect to the third clock signal CK(3); the gate of the twelfth thin film transistor NT1 is used to connect to the scan signal G(2) of the second stage; and the gate of the tenth thin film transistor NT2 is used to connect to a scan signal G(6) of a sixth stage. Correspondingly, at this time, the first driving signal output by the first output node R(N) can be used as the scan signal G(4) of the fourth stage, and the second driving signal GLS(N) output by the second output node S(N) may be a driving signal GLS(4).

In summary, the gate driving circuit provided by the present disclosure can work normally by recycling four clock signal lines, which reduces a number of clock signal lines used, and is conducive to realizing a narrow frame. Apparently, the gate driving circuit provided in the present disclosure can also use other numbers of clock signal lines, for example, six or eight.

Figure 7:
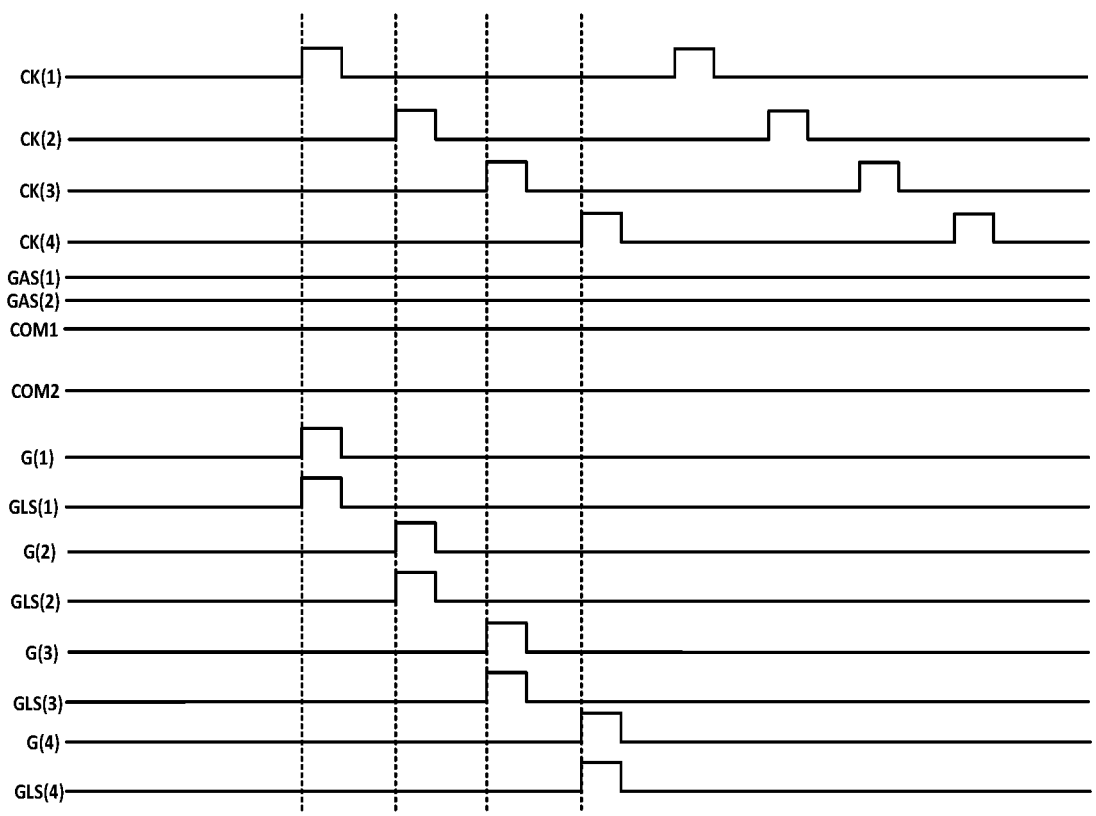
FIG. 7 is a schematic timing diagram of the gate driving circuit provided by the embodiment of the present disclosure.

As shown in FIG. 7, based on the above analysis, an operating timing of the gate driving circuit provided in the present disclosure can be as follows:

During a normal operation of the gate driving circuit, the first global control signal GAS1 may be a low potential signal, and the second global control signal GAS2 may be a high potential signal. When the display panel enters a touch phase, the first global control signal GAS1 may be a high potential signal, and the second global control signal GAS2 may be a low potential signal. The second constant high voltage potential signal COM1 may be continuously at a high potential, and the second constant low voltage potential signal COM2 may also be continuously at a low potential.

The first clock signal CK(1) can be simultaneously output as the scan signal G(1) of the first stage and the driving signal GLS(1) with a same phase.

The second clock signal CK(2) can be simultaneously output as the scan signal G(2) of the second stage and the driving signal GLS(2) with a same phase.

The third clock signal CK(3) can be output simultaneously as the scan signal G(3) of the third stage and the driving signal GLS(3) with a same phase.

The fourth clock signal CK(4) can be output at simultaneously as the scan signal G(4) of the fourth stage and the driving signal GLS(4) with a same phase.

In one of the embodiments, this embodiment provides a gate driving circuit. The gate driving circuit comprises a plurality of cascaded gate driving modules. One of the gate driving modules comprises a first transistor, a second transistor, a third transistor, and a fourth transistor, one of a source or a drain of the first transistor is electrically connected to a first output node R(N), and the first output node R(N) is used to output a first driving signal; one of a source or a drain of the second transistor is electrically connected to the first output node R(N), and a gate of the second transistor is electrically connected to a pull-down node P(N); a gate of the third transistor is electrically connected to the first output node R(N), one of a source or a drain of the third transistor is electrically connected to a second output node S(N), and the second output node S(N) is used to output a second driving signal GLS(N); a gate of the fourth transistor is electrically connected to the pull-down node P(N), and one of a source or a drain of the fourth transistor is electrically connected to the second output node S(N);

wherein, a phase of the first driving signal is same as a phase of the second driving signal GLS(N).

It can be understood that the gate driving circuit provided in this embodiment can output the first driving signal through the first output node R(N), and can output the second driving signal GLS(N) with a same phase as the first driving signal through the second output node S(N), which can not only output a plurality of driving signals of a same phase, but also simplifies the circuit topology of the gate driving circuit by sharing the first output node R(N) and the pull-down node P(N), thereby conductive to realizing the narrow frame of the display panel.

It should be noted that the first transistor may be the third thin film transistor NT9 in the above embodiment. The second transistor may be the sixth thin film transistor NT10 in the above embodiment. The third transistor may be the first thin film transistor NT12 in the above embodiment. The fourth transistor may be the second thin film transistor NT13 in the above embodiment.

In one of the embodiments, one of the gate driving modules further comprises a fifth transistor, and one of a source or a drain of the fifth transistor is electrically connected to a gate of the first transistor.

It should be noted that the fifth transistor may be the fourth thin film transistor NT7 in the above-mentioned embodiment.

In one of the embodiments, the first wire is electrically connected to another one of the source or the drain of the second transistor for transmitting the first constant low voltage potential signal VGL; the second wire is connected to another one of the source or the drain of the fourth transistor for transmitting the second constant low voltage potential signal COM2; the third wire is electrically connected to the gate of the fifth transistor for transmitting the first constant high voltage potential signal VGH; the fourth wire is electrically connected to another one of the source or the drain of the third transistor for transmitting the second constant high voltage potential signal COM1.

In one of the embodiments, this embodiment provides a display panel, which comprises the gate driving circuit in any of the above embodiments, a plurality of scan lines, and a light-shielding metal layer, and one of the scan lines is electrically connected to one of the first output node R(N) or the second output nodes S(N); the light-shielding metal layer comprises at least one light-shielding metal block, and the at least one light-shielding metal block is electrically connected to another one of the first output node R(N) or the second output node S(N).

It can be understood that, the display panel provided in this embodiment outputs the first driving signal through the first output node R(N), and outputs the second driving signal GLS(N) with a same phase as the first driving signal through the second output node S(N), which can not only output a plurality of driving signals of a same phase, but also simplifies a circuit topology of the gate driving circuit by sharing the first output node R(N) and the pull-down node P(N), thereby beneficial to realize the narrow frame of the display panel. At the same time, a corresponding scan line and the light-shielding metal layer are connected with driving signals with a same phase, which can reduce a voltage difference between the two, thereby reducing a coupling effect of a corresponding light-shielding metal block, and reducing or preventing false switching or current leakage of a thin-film transistor corresponding to the light-shielding metal block.

It should be noted that the display panel may comprise an array substrate provided with a plurality of thin film transistors, each thin film transistor has at least one active region, and each light-shielding metal block can be configured to shield light for one active region, which can stabilize an operating state of a corresponding thin film transistor.

In one of the embodiments, the display panel further comprises a display area and a non-display area, at least one light-shielding metal block is located in the display area; and at least part of one of the scan lines is located in the non-display area.

In one of the embodiments, in a thickness direction of the display panel, one of the scan lines at least partially overlaps with the at least one light-shielding metal block.

It can be understood that, for those of ordinary skilled in the art, equivalent replacements or changes can be made according to the technical solutions of the present disclosure and the inventive concept, and all these changes or replacements shall fall within protection scopes of the appended claims of the present disclosure.

What is claimed is:

1. A gate driving circuit, comprising a plurality of cascaded gate driving modules, wherein one of the gate driving modules comprises:
    a gate driving sub-module comprising a first output node and a pull-down node, wherein the first output node is used to output a first driving signal; and
    an in-phase output sub-module comprising a first control node, a second control node, and a second output node, wherein the first control node is directly electrically connected to the first output node, and the second control node is electrically connected to the pull-down node, the second output node is used to output a second driving signal, and a phase of the second driving signal is same as a phase of the first driving signal.

2. A display panel, comprising:
    a gate driving circuit of claim 1;
    a plurality of scan lines, wherein one of the scan lines is electrically connected to one of a first output node or a second output node; and
    a light-shielding metal layer comprising at least one light-shielding metal block, wherein the at least one light-shielding metal block is electrically connected to another one of the first output node and the second output node.

3. The display panel according to claim 2, wherein the display panel further comprises:
    a display area, wherein the at least one light-shielding metal block is located in the display area; and
    a non-display area, wherein at least part of the one of the scan lines is located in the non-display area.

4. The display panel according to claim 2, wherein, in a thickness direction of the display panel, the one of the scan lines at least partially overlaps the at least one light-shielding metal block.

5. A gate driving circuit, comprising a plurality of cascaded gate driving modules, wherein one of the gate driving modules comprises:
    a gate driving sub-module comprising a first output node and a pull-down node, wherein the first output node is used to output a first driving signal; and
    an in-phase output sub-module comprising a first control node, a second control node, and a second output node, wherein the first control node is electrically connected to the first output node, and the second control node is electrically connected to the pull-down node, the second output node is used to output a second driving signal, and a phase of the second driving signal is same as a phase of the first driving signal, wherein the one of the gate driving modules further comprises:
a first wire electrically connected to the gate driving sub-module for transmitting a first constant voltage low potential signal;
a second wire electrically connected to the in-phase output sub-module for transmitting a second constant voltage low potential signal;
a third wire electrically connected to the gate driving sub-module for transmitting a first constant voltage high potential signal; and
a fourth wire electrically connected to the in-phase output sub-module for transmitting a second constant voltage high potential signal.

6. The gate driving circuit according to claim 5, wherein the gate driving sub-module comprises:
a pull-up unit; and
a pull-down unit, wherein an output terminal of the pull-down unit is electrically connected to an output terminal of the pull-up unit and the first output node.

7. The gate driving circuit according to claim 6, wherein the gate driving sub-module further comprises:
a pull-down control unit, wherein an output terminal of the pull-down control unit is electrically connected to a control terminal of the pull-down unit and the pull-down node.

8. The gate driving circuit according to claim 7, wherein the gate driving sub-module further comprises:
an input unit, wherein an output terminal of the input unit is electrically connected to a pull-up node.

9. The gate driving circuit according to claim 8, wherein the gate driving sub-module further comprises:
a feedback unit, wherein an input terminal of the feedback unit is electrically connected to the first wire, a control terminal of the feedback unit is electrically connected to the pull-down node, and an output terminal of the feedback unit is electrically connected to the pull-up node.

10. The gate driving circuit according to claim 9, wherein the gate driving sub-module further comprises:
a first voltage stabilizing unit, wherein one terminal of the first voltage stabilizing unit is electrically connected to the first wire, and another terminal of the first voltage stabilizing unit is electrically connected to the pull-up node.

11. The gate driving circuit according to claim 10, wherein the gate driving sub-module further comprises:
a second voltage stabilizing unit, wherein one terminal of the second voltage stabilizing unit is electrically connected to the first wire, and another terminal of the second voltage stabilizing unit is electrically connected to the pull-down node.

12. The gate driving circuit according to claim 11, wherein the in-phase output sub-module comprises:
a first thin film transistor, wherein one of a source and a drain of the first thin film transistor is electrically connected to the fourth wire, and a gate of the first thin film transistor is electrically connected to the first output node; and
a second thin film transistor, wherein one of a source or a drain of the second thin film transistor is electrically connected to another one of the source or the drain of the first thin film transistor and the second output node, a gate of the second thin film transistor is electrically connected to the pull-down node, and another one of the source or the drain of the second thin film transistor is electrically connected to the second wire.

13. The gate driving circuit of claim 12, wherein the pull-up unit comprises:
a third thin film transistor, wherein one of a source or a drain of the third thin film transistor is electrically connected to a fifth wire, and another one of the source or the drain of the third thin film transistor is electrically connected to the first output node.

14. The gate driving circuit of claim 13, wherein the pull-up unit further comprises:
a fourth thin film transistor, wherein one of a source or a drain of the fourth thin film transistor is electrically connected to a gate of the third thin film transistor, and a gate of the fourth thin film transistor is electrically connected to the third wire.

15. The gate driving circuit of claim 14, wherein the pull-up unit further comprises:
a fifth thin film transistor, wherein one of a source or a drain of the fifth thin film transistor is electrically connected to the first output node, and a gate of the fifth thin film transistor is electrically connected to a sixth wire and another one of the source or the drain of the fifth thin film transistor.

16. The gate driving circuit of claim 15, wherein the pull-down unit comprises:
a sixth thin film transistor, wherein one of a source or a drain of the sixth thin film transistor is electrically connected to the first output node, a gate of the sixth thin film transistor is electrically connected to the pull-down node, and another one of the source or the drain of the sixth thin film transistor is electrically connected to the first wire.

17. The gate driving circuit according to claim 16, wherein the pull-down control unit comprises:
a seventh thin film transistor, wherein one of a source or a drain of the seventh thin film transistor is electrically connected to a seventh wire, and a gate of the seventh thin film transistor is electrically connected to an eighth wire;
an eighth thin film transistor, wherein a gate of the eighth thin film transistor is electrically connected to another one of the source or the drain of the seventh thin film transistor, and one of a source or a drain of the eighth thin film transistor is electrically connected to a ninth wire, and another one of the source or the drain of the eighth thin film transistor is electrically connected to the pull-down node; and
a ninth thin film transistor, wherein one of a source or a drain of the ninth thin film transistor is electrically connected to a tenth wire, another one of the source or the drain of the ninth thin film transistor is electrically connected to the gate of the eighth thin film transistor, and a gate of the ninth thin film transistor is electrically connected to an eleventh wire.

18. A gate driving circuit, comprising a plurality of cascaded gate driving modules, wherein one of the gate driving modules comprises:
a first transistor, wherein one of a source or a drain of the first transistor is electrically connected to a first output node, and the first output node is used for outputting a first driving signal;
a second transistor, wherein one of a source or a drain of the second transistor is electrically connected to the first output node, and a gate of the second transistor is electrically connected to a pull-down node;
a third transistor, wherein a gate of the third transistor is electrically connected to the first output node, one of a source or a drain of the third transistor is electrically connected to a second output node, and the second output node is used to output a second driving signal; and a fourth transistor, wherein a gate of the fourth transistor is electrically connected to the pull-down node, and one of a source or a drain of the fourth transistor is electrically connected to the second output node;

wherein a phase of the first driving signal is same as a phase of the second driving signal.

19. The gate driving circuit according to claim 18, wherein the one of the gate driving modules further comprises:

a fifth transistor, wherein one of a source or a drain of the fifth transistor is electrically connected to a gate of the first transistor.

20. The gate driving circuit of claim 19, wherein the one of the gate driving modules further comprises:

a first wire electrically connected to another one of the source or the drain of the second transistor for transmitting a first constant voltage low potential signal;

a second wire electrically connected to another one of the source or the drain of the fourth transistor for transmitting a second constant voltage low potential signal;

a third wire electrically connected to a gate of the fifth transistor for transmitting a first constant voltage high potential signal; and a fourth wire electrically connected to another one of the source or the drain of the third transistor for transmitting a second constant voltage high potential signal.

\* \* \* \* \*